(12) United States Patent
Nedovic et al.

(10) Patent No.: US 8,138,798 B2
(45) Date of Patent: Mar. 20, 2012

(54) SYMMETRIC PHASE DETECTOR

(75) Inventors: Nikola Nedovic, San Jose, CA (US); H. Anders Kristensson, Los Gatos, CA (US); William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/511,340

(22) Filed: Jul. 29, 2009

(65) Prior Publication Data

US 2010/0090723 A1 Apr. 15, 2010

Related U.S. Application Data

(60) Provisional application No. 61/084,467, filed on Jul. 29, 2008.

(51) Int. Cl.
  *G01R 25/00* (2006.01)
  *H03D 13/00* (2006.01)
(52) U.S. Cl. ............................................. 327/3; 331/25
(58) Field of Classification Search .............. 327/2, 3, 327/5, 7, 8, 10; 331/25
  See application file for complete search history.

(56) References Cited

U.S. PATENT DOCUMENTS

| | | | | |
|---|---|---|---|---|
| 4,920,278 | A * | 4/1990 | Nawata | 327/3 |
| 5,039,889 | A * | 8/1991 | Janta et al. | 327/3 |
| 5,343,097 | A * | 8/1994 | Takeuchi | 327/3 |
| 7,444,085 | B2 | 10/2008 | Ikeuchi | |
| 2003/0198105 | A1 | 10/2003 | Yamaguchi | |
| 2007/0006053 | A1 | 1/2007 | Otto | |
| 2007/0047972 | A1 | 3/2007 | Ikeuchi | |
| 2008/0260071 | A1 | 10/2008 | Sidiropoulos | |
| 2008/0309319 | A1 | 12/2008 | Hermann | |
| 2009/0149149 | A1* | 6/2009 | Ruijs | 455/323 |
| 2009/0237128 | A1 | 9/2009 | Qiao | |
| 2010/0085086 | A1 | 4/2010 | Nedovic | |

(Continued)

FOREIGN PATENT DOCUMENTS

WO 2008/018034 2/2008

(Continued)

OTHER PUBLICATIONS

SerDes Framer Interface Level 5 Phase 2 (SFI-5.2): Implementation Agreement for *40Gb/s* Interface for Physical Layer Devices, IA# OIF-SFI5-02.0, Oct. 2, 2006.

(Continued)

*Primary Examiner* — Patrick O'Neill
(74) *Attorney, Agent, or Firm* — Baker Botts L.L.P.

(57) ABSTRACT

In one embodiment, a circuit includes a first circuit input for receiving a first input signal having a first phase; a second circuit input for receiving a second input signal having a second phase; a circuit output for outputting a circuit output signal; a first mixer cell comprising a first mixer cell input, a second mixer cell input, and a first mixer cell output; and a second mixer cell comprising a third mixer cell input, a fourth mixer cell input, and a second mixer cell output. The first circuit input is connected to the first and second mixer cell inputs, the second circuit input is connected to the second and fourth mixer cell inputs, and the first and second mixer cell outputs are combined to provide the circuit output. The current of the circuit output signal is proportional to a phase offset between the first and second phases.

20 Claims, 6 Drawing Sheets

U.S. PATENT DOCUMENTS

| | | |
|---|---|---|
| 2010/0086075 A1 | 4/2010 | Parikh |
| 2010/0090723 A1 | 4/2010 | Nedovic |
| 2010/0090733 A1 | 4/2010 | Kristensson |
| 2010/0091925 A1 | 4/2010 | Nedovic |
| 2010/0091927 A1 | 4/2010 | Walker |
| 2010/0104057 A1 | 4/2010 | Nedovic |

FOREIGN PATENT DOCUMENTS

| | | | |
|---|---|---|---|
| WO | WO 2008/018034 A2 | * | 2/2008 |

OTHER PUBLICATIONS

Hanumolu, P. K. et al., "A Wide-Tracking Range Clock and Data Recovery Circuit", *IEEE JSSC*, 43:2, Feb. 2008.

Lee, J. et al., "A 40-Gb/s Clock and Data Recovery Circuit in O.18-/-tm CMOS Technology", IEEE Journal of Solid-State Circuits, 38:12, Dec. 2003.

Nedovic, N. et al., "A 40-44Gb/s 3x Oversampling CMOS CDR/1:16 DEMUX", ISSCC Digest of Technical Papers, 2007.

Staszewski, R. B. et al, "All-Digital TX Frequency Synthesizer and Discrete-Time Receiver for Bluetooth Radio in 130-nm CMOS", *IEEE JSSC*, 39:12, Dec. 2004.

Office Action for U.S. Appl. No. 12/510,211, Aug. 23, 2010.

Office Action for U.S. Appl. No. 12/511,340, Sep. 28, 2010.

Office Action for U.S. Appl. No. 12/511,352, Oct. 29, 2010.

Office Action for U.S. Appl. No. 12/510,211, Feb. 10, 2011.

Dally, William et al., "Digital Systems Engineering," Cambridge University Press, Cambridge, UK, 2008.

Office Action for U.S. Appl. No. 12/511,365, Oct. 25, 2011.

Scalable SerDes Framer Interface (SFI-S): Implementation Agreement for Interfaces beyond 40G for Physical Layer Devices, IA# OIF-SFI-S-01.0, Nov. 2008.

Von Bueren, George et al, "5.75 to 44Gb/s Quarter Rate CDR with Data Rate Selection in 90nm Bulk CMOSs," 34th European Solid-State Circuits Conference, ESSCIRC, 2008.

Savoj, Jafar et al., "Design of Half-Rate Clock and Data Recovery Circuits for Optical Communication Systems," Proceedings of Design Automation Conference, 2001.

\* cited by examiner

US 8,138,798 B2

SYMMETRIC PHASE DETECTOR

RELATED APPLICATION

This application claims the benefit, under 35 U.S.C. §119 (e), of U.S. Provisional Patent Application No. 61/084,467, entitled Symmetric Phase Detector, filed 29 Jul. 2008.

TECHNICAL FIELD

The present disclosure relates generally to signal communication.

BACKGROUND

CDR circuits (or systems) are generally used to sample an incoming data signal, extract the clock from the incoming data signal, and retime the sampled data. A phase-locked loop (PLL)-based CDR circuit is a conventional type of CDR circuit. By way of example, in a conventional PLL based CDR, a phase detector compares the phase between input data bits from a serial input data stream and a clock signal from a voltage-controlled oscillator (VCO). In response to the phase difference between the input data and the clock, the phase detector generates signals UP and DN. A charge pump drives a current to or from a loop filter according to the UP and DN signals. The loop filter generates a control voltage $V_{CTRL}$ for the VCO based on the UP and DN signals. The loop acts as a feedback control system that tracks the phase of input data stream with the phase of the clock that the loop generates. The dynamics of the loop are generally determined by the open loop gain and the location of open loop zeroes and poles (predominantly in the loop filter).

When multiple phases of a periodic signal are needed, such as with a clock signal used for clock and data recovery (CDR), a challenge is to accurately generate these multiple phases. Conventionally, delay-locked loops (DLL) and phase interpolators (PI) have been used to generate the needed phases in conjunction with conventional voltage-controlled oscillators. One problem with these devices is the accuracy obtained when generating phases having intermediate degree increments.

Various applications such as DLLs, 90 degree shifters, phase interpolators, and generators of adjustable clock phases require a high-speed phase detector whose output is zero for a 90 degree or other non-zero phase offset between inputs. The speed of conventional phase detectors, such as a phase and frequency detector (PFD) or an Alexander Detector, are limited by the speed of the flip-flops which are their integral parts. In addition, these conventional phase detectors are designed to output zero for nominal zero input phase offset, and are typically asymmetric in that the output of such phase detectors has a built-in phase offset between its inputs. The phase offset output from the phase detector typically cannot be compensated.

DESCRIPTION OF EXAMPLE EMBODIMENTS

Particular embodiments relate to a clock and data recovery (CDR) circuit. Particular embodiments relate to a CDR circuit that includes a phase interpolator integrated with a phase detector. Particular embodiments relate to the generation of an 8-phase clock signal from a 4-phase clock signal for use as a sampling clock signal in a 40 Gb/s quarter-rate CDR circuit. Particular embodiments relate to a 10 GHz phase interpolator for a 40 Gb/s CDR circuit. Particular embodiments relate to a phase detector that is symmetric with respect to the inputs to the phase detector. Particular embodiments relate to a high-speed phase detector for periodic input signals (e.g., clock signals). Particular embodiments relate to a phase detector having an output that is zero for a 90° or other non-zero phase offset between the inputs to the phase detector. Particular embodiments further relate to the use of parallel cross-coupled Gilbert cells for use in a phase detector. In particular embodiments, the signals described below are differential signals where appropriate. In particular embodiments, various signals described below are periodic signals, where appropriate.

Figure 1:
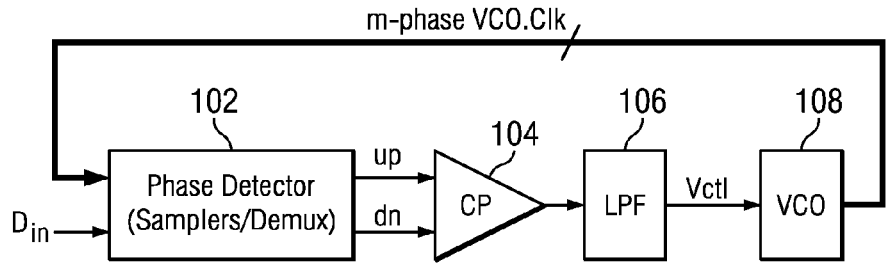
FIG. 1 illustrates an example CDR circuit.

FIG. 1 illustrates an example CDR circuit that includes a phase detector (PD) 102, a charge pump 104, a loop filter 106, and a voltage-controlled oscillator (VCO) 108, each of which may include one or more sub-circuits or sub-blocks. In particular embodiments, PD 102 receives as input one or more input data streams $D_{in}$ as well as a multi-phase clock signal, VCO.Clk, from VCO 108. Here it should be noted that, in general, an m-phase clock signal actually includes m clock signals, each having different relative phase and each transmitted over, for example, a corresponding wire to PD 102. PD 102 is used to sample the data in the one or more input data streams $D_{in}$ multiple times within each VCO.Clk clock cycle, whereas VCO 108 is used to generate the appropriate clock phases for the multi-phase signal VCO.Clk that control the timing of the sampling. In typical CDRs, the data is sampled twice per cycle: at the data transition point (edge sample) and at the middle of the cycle (center sample).

In particular embodiments, to relax the bandwidth requirements in PD 102 and VCO 108, the operating frequency of the CDR may be 1/n of the data rate of $D_{in}$, which requires that PD 102 receive multiple clock phases. By way of example, half-rate CDR architectures require four clock phases (e.g., 0°, 90° ($\pi/2$), 180° ($\pi$), and 270° ($3\pi/2$)) and quarter-rate CDR architectures require eight clock phases (e.g., 0°, 45°, 90°, 135°, 180°, 225°, 270°, and 315°). In general, 1/n-rate CDR architectures require m=2×n clock phases. Furthermore, other CDR architectures may require more than two samples per clock cycle. By way of example, if j samples per clock cycle are required, then the corresponding 1/n-rate CDR would require m=j×n clock phases. For purposes of simplified illustration of example embodiments, the following disclosure focuses on embodiments utilizing conventional CDRs with one edge and one center sample per cycle (m=2×n).

Figure 2:
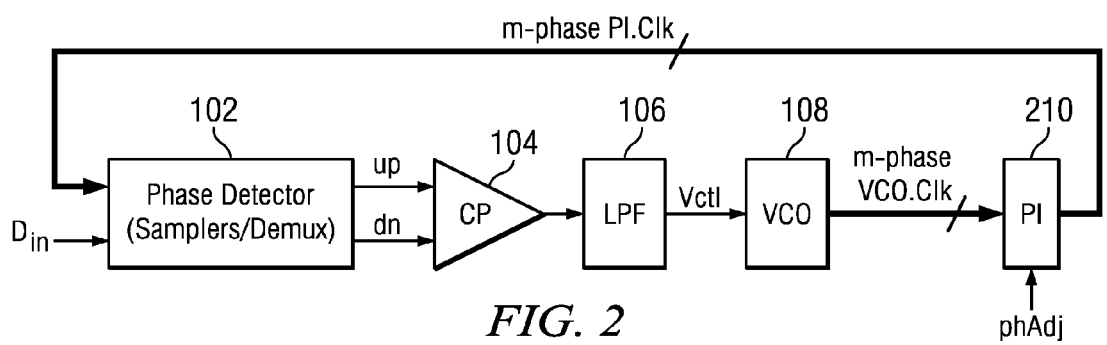
FIG. 2 illustrates another example CDR circuit.

Generally, one requirement of a CDR is the capability to adjust the decision phase (i.e., the center sample time relative to the edge sample). In particular embodiments, this phase adjustment functionality may be implemented with the use of a phase interpolator (PI) block 210 connected between PD 102 and VCO 108, as illustrated in FIG. 2. A phase interpolator generally receives two input signals separated by a phase offset (e.g., 90°) and generates an output signal having a phase in between the phases of the two input signals depending on a control signal. In particular embodiments, PI block 210 receives as inputs an m-phase clock signal, VCO.Clk, generated from VCO 108 as well as a control input, phAdj, and produces an m-phase clock signal PI.Clk that is then fed to PD 102 for use in sampling the input data stream $D_{in}$. The input phAdj determines the sign and magnitude of the phase adjustment.

Figure 3:
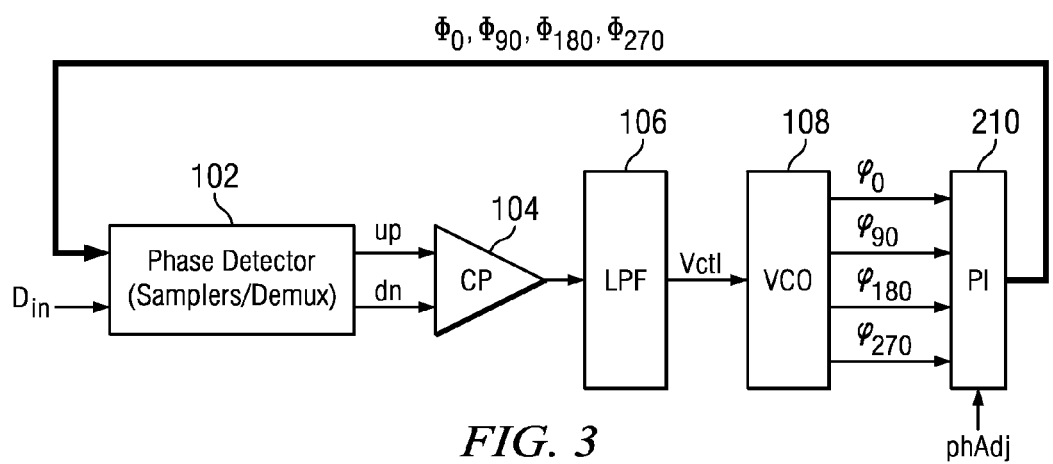
FIG. 3 illustrates an example half-rate CDR circuit.

FIG. 3 illustrates an example of a half-rate CDR circuit. The circuit of FIG. 3 is a special case of the circuit of FIG. 2 in which VCO 108 generates a 4-phase clock signal VCO.Clk. VCO.Clk includes clock signals $\phi_0$, $\phi_{90}$, $\phi_{180}$, and $\phi_{270}$, having phases of approximately 0°, 90°, 180°, and 270°, respectively (note that there is a 90° phase difference between the individual signals). PI block 210 receives the clock signals $\phi_0$, $\phi_{90}$, $\phi_{180}$, and $\phi_{270}$ and outputs four phase-interpolated clock signals $\Phi_0$, $\Phi_{90}$, $\Phi_{180}$, and $\Phi_{270}$, which have phases of approximately 0°, 90°, 180°, and 270°, respectively. In particular embodiments, the four phase-interpolated clock signals may have phase differences with respect to each other that are not 90°. PI block 210 may skew phases (such as, for example, $\Phi_{90}$ and $\Phi_{270}$ with respect to $\Phi_0$ and $\Phi_{180}$) to support phase adjustment capability, as described above. Note that since VCO.Clk represents differential signals, $\phi_0$ and $\phi_{180}$ may represent one differential pair, $\phi_{90}$ and $\phi_{270}$ may represent one differential pair, $\Phi_0$ and $\Phi_{180}$ may represent one differential pair, and $\Phi_{90}$ and $\Phi_{270}$ may represent one differential pair. Thus, VCO.Clk may actually include two differential signals in practice.

High data rate CDRs are often implemented as quarter-rate architectures with inductor-capacitor (LC)-based VCOs. By way of example, high data rates may refer to data rates equal or greater than 10 Gb/s, equal or greater than 20 Gb/s, or equal or greater than 40 Gb/s. Quarter-rate CDRs generally require eight or more clock phases, the generation and delivery of which present numerous difficulties using LC-based VCOs, partly due to the number of inductors required. LC-based VCOs can relatively easily produce two or four clock phases, but become difficult to deal with when more phases (e.g., 8, 12 or more) are required.

Figure 4:
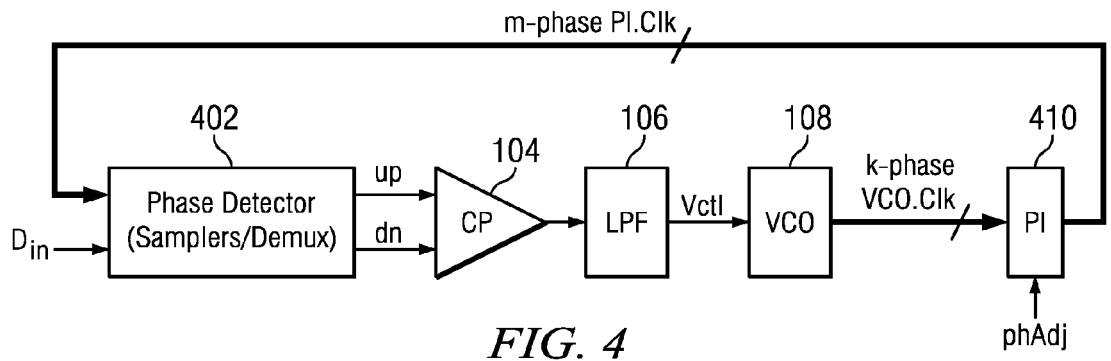
FIG. 4 illustrates another example CDR circuit.

In particular embodiments, the generation of the extra intermediate phases needed for, by way of example, quarter-rate CDRs, is combined with the phase adjustment requirement using a single PI block 410 as illustrated in FIG. 4. Particular embodiments use a low noise oscillator such as an LC-based VCO 102 as a k-phase clock generator to generate a k-phase clock signal (where k≧2) input to PI block 410. In particular embodiments, PI block 410 receives the k-phase clock signal from VCO 108 and produces an m-phase clock signal for use by phase detector 402, where m≠k (unlike previous conventional CDR architectures that produce the same number of phases as are received).

Figure 5:
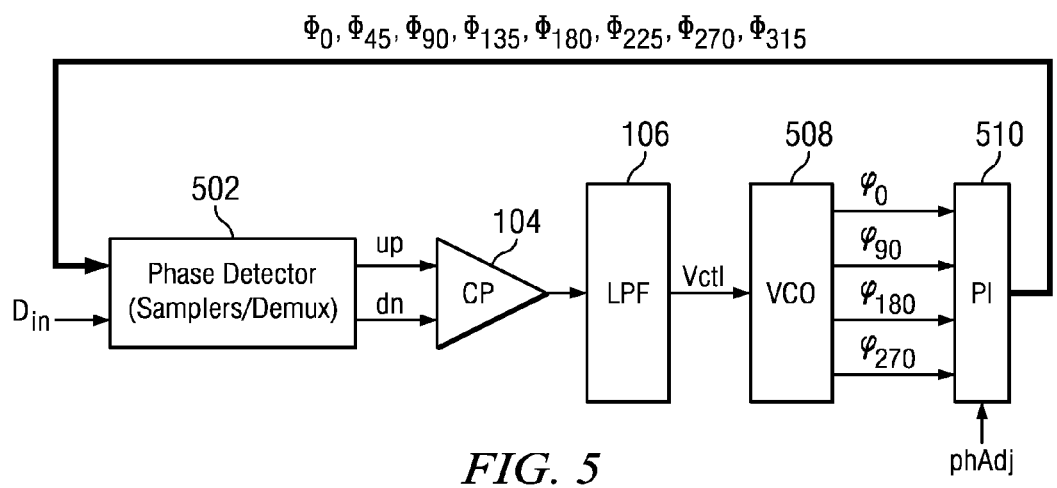
FIG. 5 illustrates an example quarter-rate CDR circuit.

FIG. 5 illustrates an example embodiment of a quarter-rate CDR circuit. In the illustrated embodiment, VCO 508 produces a 4-phase clock signal including clock signals $\phi_0$, $\phi_{90}$, $\phi_{180}$, and $\phi_{270}$, having phases of approximately 0°, 90°, 180°, and 270°, respectively. These four clock signals $\phi_0$, $\phi_{90}$, $\phi_{180}$, and $\phi_{270}$ are input to PI block 510, which, in the illustrated embodiment, outputs an 8-phase clock signal that includes clock signals $\Phi_0$, $\Phi_{90}$, $\Phi_{180}$, and $\Phi_{270}$, having phases of approximately 0°, 90°, 180°, and 270°, respectively, along with four additional intermediately-phased clock signals $\Phi_{45}$, $\Phi_{135}$, $\Phi_{225}$, and $\Phi_{315}$, having phases of approximately 45°, 135°, 225°, and 315°, respectively. Although this example describes 4-to-8 phase generation, the present disclosure is intended to cover the generation of m=k+l phases from a k-phase clock signal. Using PI block 510 to generate the additional intermediately-phases clock signals reduces/relaxes the requirements of VCO 508 in terms of the number of clock phases output from VCO 508. In particular embodiments, PI block 510 may also be used to adjust the decision clocks based on the phAdj control input by introducing a static phase offset. Again, it should be noted that, in particular embodiments, since VCO.Clk represents differential signals, $\phi_0$ and $\phi_{180}$ may represent one differential pair, $\phi_{90}$ and $\phi_{270}$ may represent one differential pair, $\Phi_0$ and $\Phi_{180}$ may represent one differential pair, and $\Phi_{90}$ and $\Phi_{270}$ may represent one differential pair, $\Phi_{45}$ and $\Phi_{225}$ may represent one differential pair, and $\Phi_{135}$ and $\Phi_{315}$ may represent one differential pair. Thus, VCO.Clk may actually include two differential signals in practice while PI.Clk may actually include four differential signals in practice.

Figure 6:
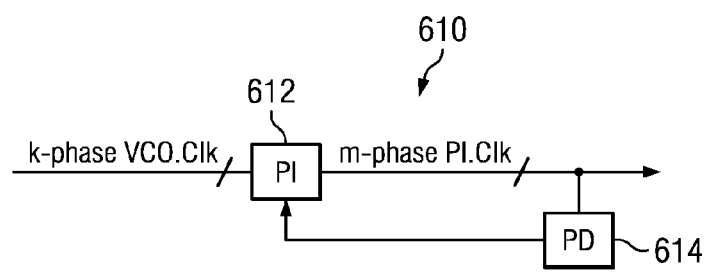
FIG. 6 illustrate an example phase interpolator block.
Figure 7:
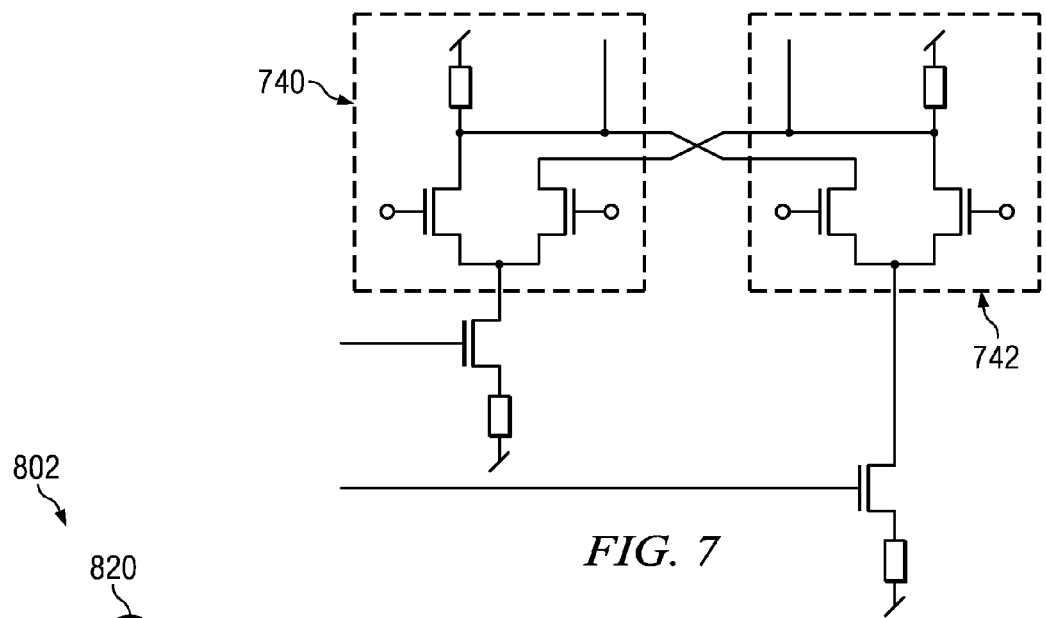
FIG. 7 illustrates an example phase interpolator.

FIG. 6 illustrates an example PI block 610 suitable for use as PI block 410 or 510. In particular embodiments, PI block 610 includes one or more phase interpolators (PIs) 612 that receive as input a k-phase clock signal and output an m-phase clock signal. In the illustrated embodiment, PI block 610 additionally includes one or more phase detectors 614 (hereinafter PD 614) in a feedback loop with PI or PIs 612 (hereinafter PI 612). As illustrated in FIG. 7, PI 612 may include two differential pairs 740 and 742 driven by appropriate input signals (e.g., $\Phi_0$ and $\Phi_{90}$ or $\Phi_{90}$ and $\Phi_{180}$). The output of PI 612 is the current summation of the differential pair, which is converted to voltage through a resistor. Thus, an approximate desired phase is achieved as a weighted sum of the two input signals. The ratio of the tail current will determine the phase and the sum of the tail currents will determine the amplitude of the output signal. In particular embodiments, the inputs to differential pairs 740 and 742 are the gates of the transistors in the differential pairs 740 and 742 and the outputs are the wires tapping the outputs of the transistors. As an example and not by way of limitation, input signal $\Phi_0$ may go the gate of the illustrated left transistor in differential pair 740; input signal $\Phi_{180}$ may go the gate of the illustrated right transistor in differential pair 740; input signal $\Phi_{90}$ may go the gate of the illustrated left transistor in differential pair 742; and input signal $\Phi_{270}$ may go the gate of the illustrated right transistor in differential pair 742. Output signal $\Phi_{225}$ may come from the illustrated vertical wire at the illustrated bottom of differential pair 740, and output signal $\Phi_{45}$ may come from the illustrated vertical wire at the illustrated bottom of differential pair 742.

In particular embodiments, PI 612 takes as input the 4-phase clock signal including clock signals $\phi_0$, $\phi_{90}$, $\phi_{180}$, and $\phi_{270}$, having phases of approximately 0°, 90°, 180°, and 270°, respectively, from VCO 508. Using these signals, PI 612 outputs an 8-phase clock signal that includes clock signals $\Phi_0$, $\Phi_{90}$, $\Phi_{180}$, and $\Phi_{270}$, having phases of approximately 0°, 90°, 180°, and 270°, respectively, along with four additional intermediately-phased clock signals $\Phi_{45}$, $\Phi_{135}$, $\Phi_{225}$, and $\Phi_{315}$, having phases of approximately 45°, 135°, 225°, and 315°, respectively. As described above, PD 614 provides feedback to PI 612 in the form of error (or control) signals that are used by PI 612 to adjust the 8-phase clock signal output. By way of example, a first PI 612 may use the input signals $\Phi_0$ and $\Phi_{90}$ to generate the output signal $\Phi_{45}$, while other PIs 612 in parallel with the first PI 612 generate the other intermediately-phase clock signals, respectively.

Figure 8A:
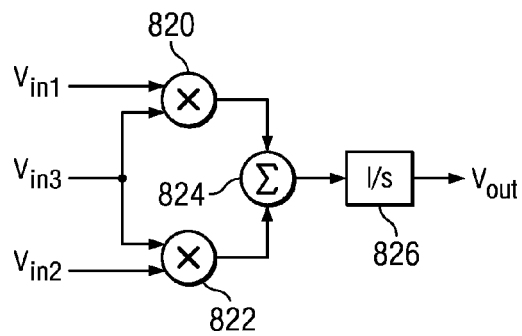
FIG. 8A illustrates an example phase detector.

FIG. 8A illustrates an example phase detector 802 suitable for use as PD 614 and/or PDs 402 or 502. In the illustrated embodiment, PD 802 includes a first PD input that receives (during operation) a first input signal $V_{in1}$, a second PD input that receives (during operation) a second input signal $V_{in2}$, and a third PD input that receives (during operation) a third input signal $V_{in3}$. Note that each of the described inputs, and those described below, may actually include two inputs: one for the described signal and one for the corresponding complement (since the signals are generally differential). In particular embodiments, input signal $V_{in1}$ is a first clock signal output by PI 612, $V_{in2}$ is a second clock signal output by PI 612, and $V_{in3}$ is a third clock signal output by PI 612. In particular embodiments, the third clock signal $V_{in3}$ may be referred to as the target phase signal. In particular embodiments, PD 802 includes a first mixer cell (or circuit/block) 820 and a second mixer cell (or circuit/block) 822. In the illustrated embodiment, first mixer cell 820 includes a first MC input, a second MC input, and a first MC output while second mixer cell 822 includes a third MC input, a fourth MC input, and a second MC output. In the illustrated embodiment, the first PD input is connected to the first MC input, the second PD input is connected to the third MC input, and the third PD input is connected to the second MC input and the fourth MC input.

In particular embodiments, PD 802 further includes an adder 824 that receives the first and second MC output signals and adds the first and second MC output signals to produce a summed output signal. In particular embodiments, PD 802 additionally includes an integrator 826 that filters the summed output signal to produce an integrated (e.g., DC) output signal that represents the PD output signal $V_{out}$ output over the PD output. In the embodiment illustrated in FIG. 6, the PD output signal $V_{out}$ represents an error signal that is then input to PI 612 and used to adjust the phase of the input signal $V_{in3}$.

Figure 9A:
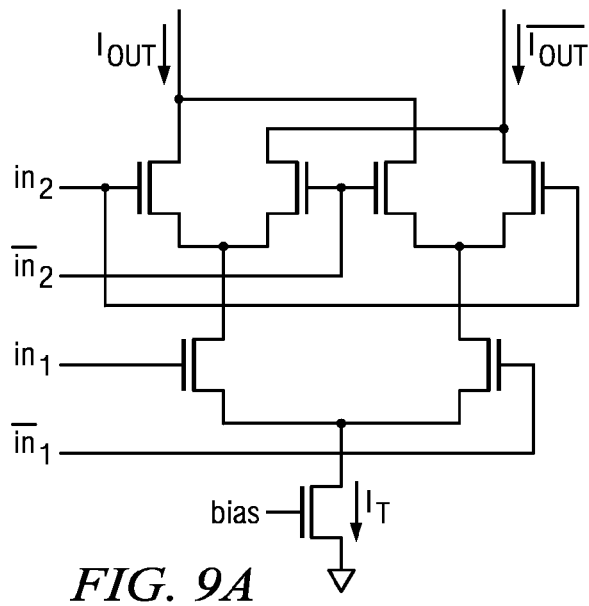
FIG. 9A illustrates a circuit schematic of an example Gilbert cell.
Figure 9B:
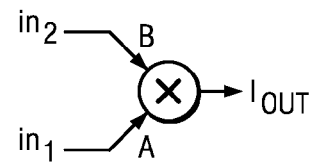
FIG. 9B illustrates a symbol of an example Gilbert cell equivalent to that of FIG. 7A.
Figure 9C:
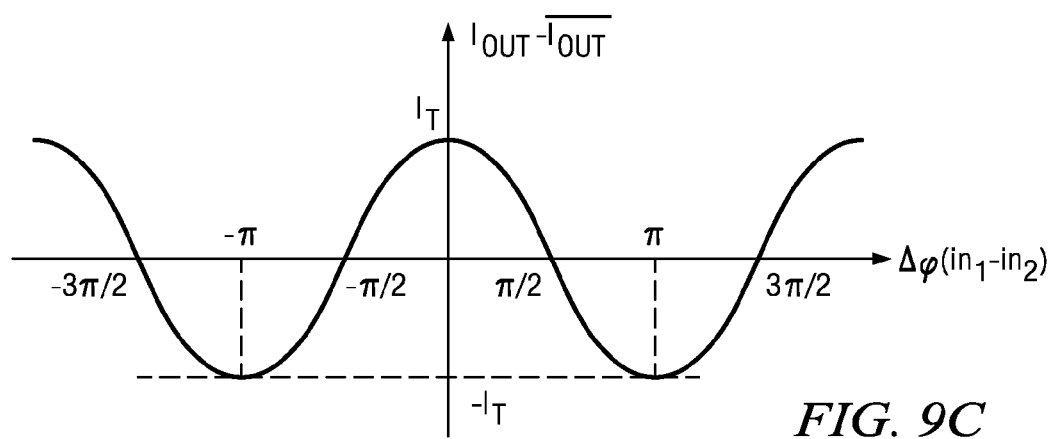
FIG. 9C illustrates a phase characteristic of the example Gilbert cell of FIG. 7A.

In particular embodiments, first mixer cell 820 is a multiplying mixer cell and second mixer cell 822 is a multiplying mixer cell. In more particular embodiments, first mixer cell 820 is a Gilbert cell and second mixer cell 822 is a Gilbert cell. As those of skill in the art may appreciate, a Gilbert cell is an electronic multiplying mixer. By way of reference, the output current of a Gilbert cell is an accurate multiplication of the (differential) base currents of both inputs. FIG. 9A illustrates a circuit schematic of an example Gilbert cell having inputs for receiving two differential signals $in_1$ (the complement of $in_1$ is denoted as $\overline{in_1}$) and $in_2$ (the complement of $in_2$ is denoted as $\overline{in_2}$). FIG. 9B illustrates an accepted equivalent symbol for a Gilbert cell, while FIG. 9C illustrates the value of the output differential signal $I_{out} - \overline{I_{out}}$ as a function of the phase offset $\Delta\phi(in_1 - in_2)$ between the differential input signals $in_1$ and $in_2$.

Figure 8B:
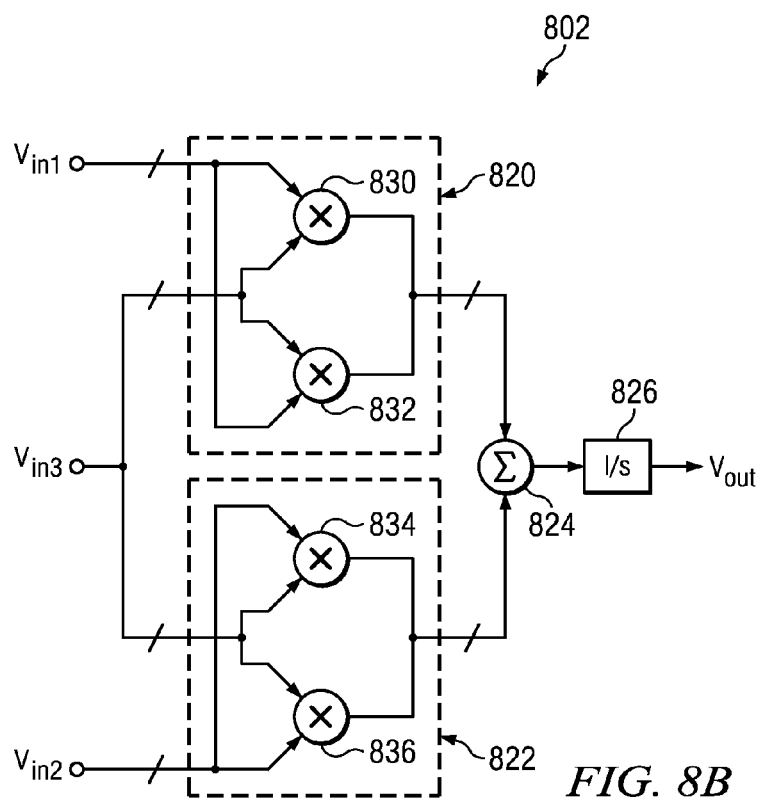
FIG. 8B illustrates another example phase detector.

In even more particular embodiments, first mixer cell 820 includes a first Gilbert cell 830 and a second Gilbert cell 832 cross-coupled in parallel, while second mixer cell 822 includes a third Gilbert cell 834 and a fourth Gilbert cell 836 cross-coupled in parallel, as illustrated in FIG. 8B. In the illustrated embodiment, a first input of first Gilbert cell 830 receives input signal $V_{in1}$ while a second input of first Gilbert cell 830 receives input signal $V_{in2}$. A first input of second Gilbert cell 832 receives input signal $V_{in2}$ while a second input of second Gilbert cell 832 receives input signal $V_{in1}$.

The outputs of first and second Gilbert cells 830 and 832 may be connected to provide the first MC output signal, as shown in the illustrate embodiment. Similarly, in the illustrated embodiment, a first input of third Gilbert cell 834 receives input signal $V_{in3}$ while a second input of third Gilbert cell 834 receives input signal $V_{in2}$. A first input of fourth Gilbert cell 836 receives input signal $V_{in2}$ while a second input of fourth Gilbert cell 836 receives input signal $V_{in3}$. The outputs of third and fourth Gilbert cells 834 and 836 may be connected to provide the second MC output signal, as shown in the illustrate embodiment.

Figure 10A:
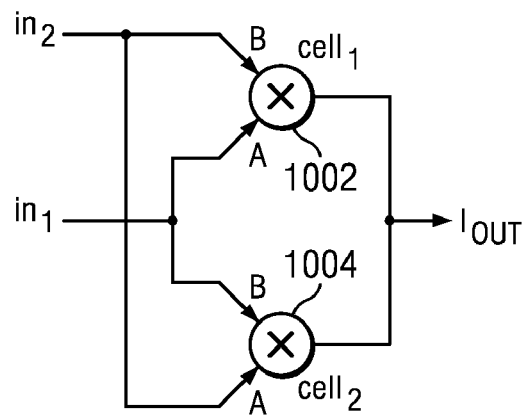
FIG. 10A illustrates an example circuit arrangement of Gilbert cells.
Figure 10B:
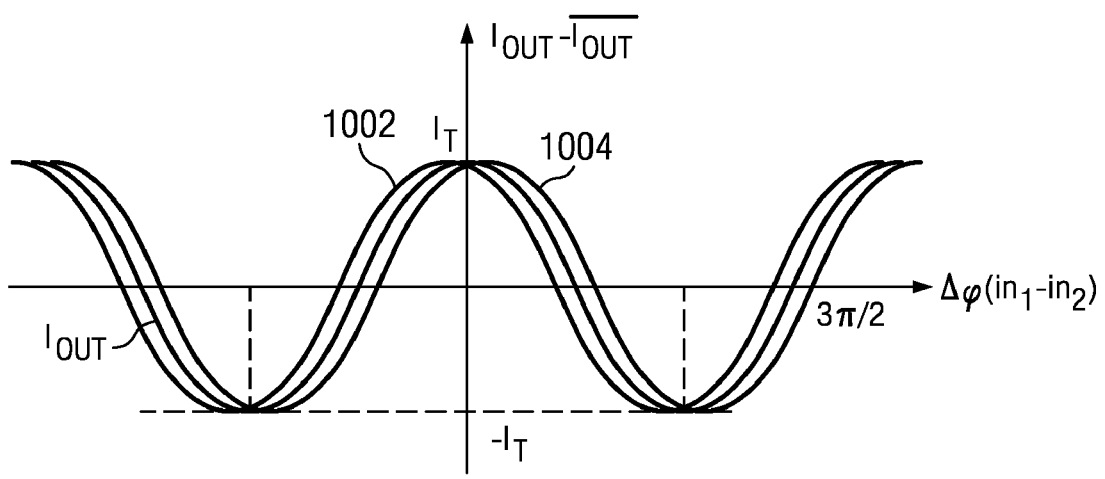
FIG. 10B illustrates a phase characteristic of the example arrangement of FIG. 8A.

In this way, the first MC output signal output from first mixer cell 820 is symmetric with respect to the inputs $V_{in1}$ and $V_{in2}$ and the second MC output signal output from second mixer cell 822 is symmetric with respect to the inputs $V_{in2}$ and $V_{in3}$. More specifically, the delay between the first input of any Gilbert cell and the output of the Gilbert cell is generally different than the delay between the second input of the Gilbert cell and the output of the Gilbert cell. This results in a static phase offset in the output signal output from the Gilbert cell. However, by cross-coupling two Gilbert cells in parallel as illustrated in each of the mixer cells 820 and 822 of FIG. 8B, the static phase offset is cancelled to at least a first approximation. FIGS. 10A and 10B illustrates a circuit that includes two Gilbert cells cross-coupled in parallel (as in each mixer cell 820 and 822) as well as the circuit's phase characteristic, respectively. The circuit shown in FIG. 10A may itself be used as a phase detector. As illustrated in FIG. 10A, the inputs to the two Gilbert cells 1002 and 1004 are interchanged: input in is connected to the input A of Gilbert cell 1002 and to input B of Gilbert cell 1004; input $in_2$ is connected to the input B of Gilbert cell 1002 and to input A of Gilbert cell 1004. The interchanging of the inputs effectively interpolates the outputs of the Gilbert cells and results in zero input offset to a first degree of approximation. Such an arrangement minimizes the phase offset (the phase delay between the inputs for which the output of the arrangement is still equal to zero).

The output, $V_{out}$, of PD 802 represents an error signal that is proportional to the difference in phase between the phase of $V_{in3}$ and the average of the phases of $V_{in1}$ and $V_{in2}$. By way of example, assume $V_{in1}$ represents $\Phi_0$, $V_{in2}$ represents $\Phi_{90}$, and $V_{in3}$ represents $\Phi_{45}$. In this example, $V_{out}$ represent an error signal that is proportional to the difference between the phase of $\Phi_{45}$, which is approximately 45° (as noted above, VCOs have difficulty generating intermediately-phased signals such as 45°, and as such the phase of $\Phi_{45}$ is only roughly equal to 45°), and the average of the phases of $\Phi_0$ and $\Phi_{90}$, which is approximately 45° since the phase of $\Phi_0$ and $\Phi_{90}$ are approximately 0° and 90°, respectively. The error signal, $V_{out}$, is then fed to PI 612, which then adjusts the phase of $\Phi_{45}$ to eliminate the phase difference (which would then result in a zero-valued error signal), which results in a $\Phi_{45}$ having a phase truer to 45°. In this manner, PD 614 provides a feedback loop to PI 612 to compensate for the inaccuracy of PI 612.

In particular embodiments, PD 614 also utilizes this circuit and process to adjust or verify the other intermediately-phased signals $\Phi_{135}$, $\Phi_{225}$, and $\Phi_{315}$ generated by PIs 612. In particular embodiments, PD 614 generates four error signals $V_{out}$ in parallel to adjust or verify signals $\Phi_{45}$, $\Phi_{135}$, $\Phi_{225}$, and $\Phi_{315}$. By way of example, to adjust or verify $\Phi_{135}$, PD 614 may receive $\Phi_{90}$ as $V_{in1}$, $\Phi_{135}$ as $V_{in2}$, and $\Phi_{180}$ as $V_{in3}$. To adjust or verify $\Phi_{225}$, PD 614 may receive $\Phi_{180}$ as $V_{in1}$, $\Phi_{225}$ as $V_{in2}$, and $\Phi_{270}$ as $V_{in3}$. To adjust or verify $\Phi_{315}$, PD 614 may receive $\Phi_{270}$ as $V_{in1}$, $\Phi_{315}$ as $V_{in2}$ and $\Phi_0$ as $V_{in3}$. Note that since the clock signals are differential signals, the signals may be inverted to obtain signals having 180° phase offsets.

It should also be appreciated that this circuit and method may be used to adjust any of the signals $\Phi_0$, $\Phi_{45}$, $\Phi_{90}$, $\Phi_{135}$, $\Phi_{180}$, $\Phi_{225}$, $\Phi_{270}$, and $\Phi_{315}$, as well as any other signal have any desired intermediate phase in between any of these signals. By way of example, PD 614 may receive $\Phi_0$ as $V_{in1}$, an additional signal $\delta$ having phase in the range between $\Phi_0$ and $\Phi_{45}$ as $V_{in2}$, and $\Phi_{45}$ as $V_{in3}$. After a number of iterations, $\delta$ will have a phase of approximately 22.5°. Additionally, by adding deliberate offsets in the feedback path an arbitrary phase (other than, for example, 45° and)135° may be created. By way of example, the phases offset may either be introduced as a weighted difference of the tail currents of the multipliers (Gilbert cells) as illustrated in FIG. 8A or by injecting a current on the output of the Gilbert cell.

Figure 11:
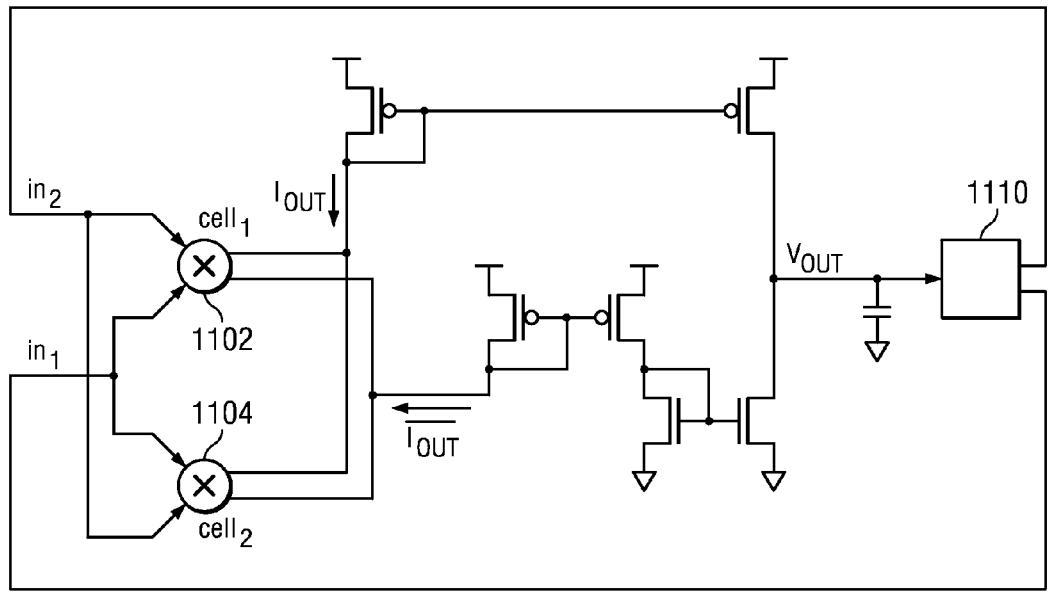
FIG. 11 illustrates an example phase detector circuit.

Referring back to FIG. 10A, in alternate embodiments (potentially unrelated to those described above), the current output, $I_{out}$, of the double Gilbert cell phase detector illustrated in FIG. 10A can be sensed by resistors to transform the output current to an output voltage and subsequently filtered. Alternatively, FIG. 11 shows an implementation of the double Gilbert cell phase detector in a negative feedback configuration. In such a configuration, the current outputs of the first and second Gilbert cells 1102 and 1104 can be mirrored and summed in a single node used to modulate the phase between the inputs $in_i$ and $in_2$. Such a configuration forces the phase difference between the inputs to 90°, so that the net current in the $V_{out}$ node is zero. A large capacitor or another form of a loop filter may be needed in such a configuration to filter the transient response of the phase detector and to govern the dynamic behavior of the loop. If used in a feedback loop, as illustrated in FIG. 11, a VCO, delay line, phase interpolator, or other suitable device can be used to control the phase difference between the two input signals $in_1$ and $in_2$, as represented by box 1110.

Figure 12:
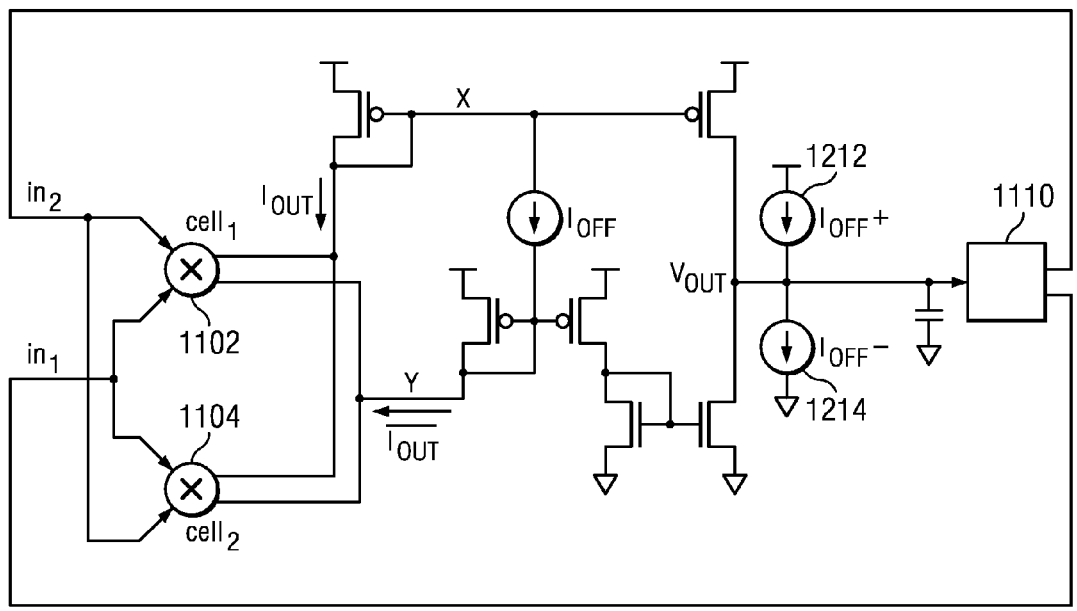
FIG. 12 illustrates an example phase detector circuit.

FIG. 12 illustrates another embodiment that involves a circuit for adjusting the phase characteristic externally. By way of example, in cases where a phase difference between the inputs $in_t$ and $in_2$ other than 90° is desired, such as for generating boundary and data clock phases in a CDR with a phase adjustment requirement, additional offset current sources 1212 and 1214 that sink or source current to or from the phase detector may be used to offset its phase characteristic. The offset current sources 1212 and 1214 may be externally controlled and can be connected either at the output of the Gilbert cells 1102 and 1104, or at the voltage summing node $V_{out}$, as illustrated in FIG. 12.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

The invention claimed is:

1. A circuit comprising:
   a first circuit input for receiving a first input signal having a first phase;
   a second circuit input for receiving a second input signal having a second phase;
   a circuit output for outputting a circuit output signal;
   a first mixer cell comprising a first mixer cell input, a second mixer cell input, and a first mixer cell output, the first mixer cell, when operating, producing a first delay between the first mixer cell input and the first mixer cell output and a second delay between the second mixer cell input and the first mixer cell output, there being a first difference between the first delay and the second delay;
   a second mixer cell comprising a third mixer cell input, a fourth mixer cell input, and a second mixer cell output, the second mixer cell, when operating, producing a third delay between the third mixer cell input and the second mixer cell output, and a fourth delay between the fourth mixer cell input and the second mixer cell output, there being a second difference between the third delay and the fourth delay; and
   a current mirror configured to mirror a current of a first-mixer-cell output signal and a current of a second-mixer-cell output signal;
   wherein:
      the first circuit input is connected to the first mixer cell input and the third mixer cell input;
      the second circuit input is connected to the second mixer cell input and the fourth mixer cell input;
      the first mixer cell output and the second mixer cell output are combined with each other to provide the circuit output by adding the mirrored current of the first-mixer-cell output signal and the mirrored current of the second-mixer-cell output signal to produce the circuit output signal; and
      when present, a current of the circuit output signal is proportional to a phase offset between the first phase and the second phase.

2. The circuit of claim 1, wherein the first difference is approximately equal to the second difference and wherein, when the first and second mixer outputs are combined, a first phase offset in the first mixer cell output resulting from the first difference is approximately canceled by a second phase offset in the second mixer cell output resulting from the second difference.

3. The circuit of claim 1, wherein:
   the first mixer cell comprises a first multiplying mixer cell; and
   the second mixer cell comprises a second multiplying mixer cell.

4. The circuit of claim 3, wherein:
   the first multiplying mixer cell comprises a first Gilbert cell; and
   the second multiplying mixer cell comprises a second Gilbert cell.

5. The circuit of claim 1, wherein the circuit is a phase detector.

6. The circuit of claim 1, further comprising a phase-difference controller configured to:
   receive as input the circuit output signal; and
   output the first and second input signals based on a predetermined phase offset between the first and second input signals.

7. The circuit of claim 6, further comprising one or more externally controlled offset-current sources configured to sink or source current to or from the circuit.

8. The circuit of claim 7, wherein the externally controlled offset-current sources are controllable to set the predetermined phase offset.

9. The circuit of claim 1, wherein the first and second input signals are periodic.

10. The circuit of claim 1, wherein the current of the circuit output signal is approximately zero when the phase offset is 90 degrees or $\pi/2$ radians.

11. A method comprising:
   receiving at a first circuit input a first input signal having a first phase, the first circuit input being connected to a first mixer cell input of a first mixer cell and to a third mixer cell input of a second mixer cell, the first mixer cell having a first mixer cell output, the second mixer cell having a second mixer cell output;

receiving at a second circuit input a second input signal having a second phase, the second circuit input being connected to a second mixer cell input of the first mixer cell and to a fourth mixer cell input of the second mixer cell;

producing at the first mixer cell a first delay between the first mixer cell input and the first mixer cell output and a second delay between the second mixer cell input and the first mixer cell output, there being a first difference between the first delay and the second delay; and producing at the second mixer cell a third delay between the third mixer cell input and the second mixer cell output, and a fourth delay between the fourth mixer cell input and the second mixer cell output, there being a second difference between the third delay and the fourth delay;

producing at a current mirror a mirrored current of a first-mixer-cell output signal and a mirrored current of a second-mixer-cell output signal; and combining the first mixer cell output and the second mixer cell output with each other to provide a circuit output signal at a circuit output by adding the mirrored current of the first-mixer-cell output signal and the mirrored current of the second-mixer-cell output signal to produce the circuit output signal, a current of the circuit output signal being proportional to a phase offset between the first phase and the second phase.

12. The method of claim 11, wherein the first difference is approximately equal to the second difference and wherein, when the first and second mixer outputs are combined, a first phase offset in the first mixer cell output resulting from the first difference is approximately canceled by a second phase offset in the second mixer cell output resulting from the second difference.

13. The method of claim 11, wherein:
the first mixer cell comprises a first multiplying mixer cell; and
the second mixer cell comprises a second multiplying mixer cell.

14. The method of claim 13, wherein:
the first multiplying mixer cell comprises a first Gilbert cell; and
the second multiplying mixer cell comprises a second Gilbert cell.

15. The method of claim 11, further comprising:
receiving at an input to a phase-difference controller the circuit output signal; and outputting from the phase-difference controller the first and second input signals based on a predetermined phase offset between the first and second input signals.

16. The method of claim 15, further comprising sinking or sourcing current to or from the circuit using one or more externally controlled offset-current sources.

17. The method of claim 16, wherein the externally controlled offset-current sources are controllable to set the predetermined phase offset.

18. The method of claim 11, wherein the first and second input signals are periodic.

19. The method of claim 11, wherein the current of the circuit output signal is approximately zero when the phase offset is 90 degrees or $\pi/2$ radians.

20. A system comprising:
means for receiving at a first circuit input a first input signal having a first phase, the first circuit input being connected to a first mixer cell input of a first mixer cell and to a third mixer cell input of a second mixer cell, the first mixer cell having a first mixer cell output, the second mixer cell having a second mixer cell output;

means for receiving at a second circuit input a second input signal having a second phase, the second circuit input being connected to a second mixer cell input of the first mixer cell and to a fourth mixer cell input of the second mixer cell;

means for producing at the first mixer cell a first delay between the first mixer cell input and the first mixer cell output and a second delay between the second mixer cell input and the first mixer cell output, there being a first difference between the first delay and the second delay; and means for producing at the second mixer cell a third delay between the third mixer cell input and the second mixer cell output, and a fourth delay between the fourth mixer cell input and the second mixer cell output, there being a second difference between the third delay and the fourth delay;

means for producing at a current mirror a mirrored current of a first-mixer-cell output signal and a mirrored current of a second-mixer-cell output signal; and means for combining the first mixer cell output and the second mixer cell output with each other to provide a circuit output signal at a circuit output by adding the mirrored current of the first-mixer-cell output signal and the mirrored current of the second-mixer-cell output signal to produce the circuit output signal, a current of the circuit output signal being proportional to a phase offset between the first phase and the second phase.

* * * * *